(12) United States Patent
Kim et al.

(10) Patent No.: US 12,136,450 B2
(45) Date of Patent: Nov. 5, 2024

(54) MEMORY AND OPERATION METHOD OF MEMORY WITH REPAIRING AND RANDOM PULSE GENERATING CAPABILITY

(71) Applicant: SK hynix Inc., Gyeonggi-do (KR)

(72) Inventors: Woongrae Kim, Gyeonggi-do (KR); Yoonna Oh, Gyeonggi-do (KR); Chul Moon Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 120 days.

(21) Appl. No.: 17/899,785

(22) Filed: Aug. 31, 2022

(65) Prior Publication Data

US 2023/0335175 A1 Oct. 19, 2023

(51) Int. Cl.
*G11C 11/406* (2006.01)
*G11C 29/00* (2006.01)
*G11C 29/52* (2006.01)

(52) U.S. Cl.
CPC .. *G11C 11/40615* (2013.01); *G11C 11/40618* (2013.01); *G11C 29/52* (2013.01); *G11C 29/785* (2013.01)

(58) Field of Classification Search
CPC ........ G11C 11/40615; G11C 11/40618; G11C 11/40603; G11C 11/40611; G11C 11/4076; G11C 11/408; G11C 29/52; G11C 29/785; G11C 29/44; G11C 2029/1202

See application file for complete search history.

(56) References Cited

U.S. PATENT DOCUMENTS

| | | | | |
|---|---|---|---|---|
| 6,144,577 A | * | 11/2000 | Hidaka | G11C 29/848 365/230.03 |
| 10,672,449 B2 | | 6/2020 | Ito et al. | |
| 2018/0005710 A1 | * | 1/2018 | Wilson | G11C 7/24 |
| 2019/0333573 A1 | * | 10/2019 | Shin | G11C 11/408 |

FOREIGN PATENT DOCUMENTS

KR 10-2018-0128711 A 12/2018

* cited by examiner

*Primary Examiner* — Sultana Begum
(74) *Attorney, Agent, or Firm* — IP & T GROUP LLP

(57) ABSTRACT

A method for operating a memory includes: receiving an active command and a row address; confirming that a portion of columns of a first row corresponding to the row address is replaced with a portion of columns of a second row; activating the first row and the second row; confirming activation of a random pulse; randomly selecting one among the row address corresponding to the first row and a row address corresponding to the second row in response to the activation of the random pulse; and sampling the selected row address as a sampling address.

8 Claims, 6 Drawing Sheets

MEMORY AND OPERATION METHOD OF MEMORY WITH REPAIRING AND RANDOM PULSE GENERATING CAPABILITY

CROSS-REFERENCE TO RELATED APPLICATIONS

The present application claims priority of Korean Patent Application No. 10-2022-0046999, filed on Apr. 15, 2022, which is incorporated herein by reference in its entirety.

BACKGROUND

1. Field

Various embodiments of the present invention relate to a memory.

2. Description of the Related Art

As the degree of integration of a memory increases, the spacing between a plurality of word lines included in the memory decreases. As the spacing between word lines decreases, the coupling effect between the neighboring word lines increases.

Moreover, whenever a data is input or output to or from a memory cell, a word line toggles between an active state and an inactive state. As the coupling effect between the neighboring word lines increases, the data in the memory cell coupled to a word line which is disposed adjacent to a frequently activated word line may be damaged. This phenomenon is referred to as Row Hammering. Since the data of a memory cell is damaged before the memory cell is refreshed due to word line disturbance, there is a problem.

FIG. 1 is a view illustrating row hammering. It shows a portion of a cell array included in a memory device.

In FIG. 1, 'WLL' may correspond to a word line with a large number of activations, and 'WLL−1' and 'WLL+1' may be word lines disposed adjacent to 'WLL', that is, word lines disposed adjacent to the word line with a large number of activations. Also, 'CL' may represent a memory cell that is coupled to the 'WLL', and 'CL−1' may represent a memory cell that is coupled to the 'WLL−1', and 'CL+1' may represent a memory cell that is coupled to the 'WLL+1'. The memory cells may include cell transistors TL, TL−1, and TL+1 and cell capacitors CAPL, CAPL−1, and CAPL+1, respectively.

When 'WLL' is activated or deactivated in FIG. 1, the voltages of 'WLL−1' and 'WLL+1' may rise or fall due to the coupling effect that occurs between the 'WLL' and the 'WLL−1' and 'WLL+1', also affecting the amount of charges in the cell capacitors CL−1 and CL+1. Therefore, when the 'WLL' is frequently activated and the 'WLL' toggles between an activated state and a deactivated state, the change in the amount of charges stored in the cell capacitors CAPL−1 and CAPL+1 that are respectively included in the 'CL−1' and the 'CL+1' may increase, and thus the data in the memory cell may be deteriorated.

Also, the electromagnetic wave generated when the word line toggles between the activated state and the deactivated state may damage the data by introducing electrons into the cell capacitor of the memory cell coupled to a neighboring word line, or discharging electrons from the cell capacitor.

Row hammering is mainly caused by an external attack from the outside of a memory, such as a hacking. As a method for coping with a row hammering attack, a method of randomly sampling an activated row and refreshing neighboring rows of the sampled row may be used. The randomly sampled rows are highly likely to be over-activated, so this method may be used.

SUMMARY

Embodiments of the present disclosure are directed to coping with a row hammering attack applied to a memory.

In accordance with an embodiment of the present disclosure, a method for operating a memory includes: receiving an active command and a row address; confirming that a portion of columns of a first row corresponding to the row address is replaced with a portion of columns of a second row; activating the first row and the second row; confirming activation of a random pulse; randomly selecting one among the row address corresponding to the first row and a row address corresponding to the second row in response to the activation of the random pulse; and sampling the selected row address as a sampling address.

In accordance with another embodiment of the present disclosure, a memory includes: a cell array including a plurality of memory cells that are arranged in a plurality of rows and a plurality of columns; a repair circuit suitable for storing information about one or more defective rows having a failure in a portion of columns among the rows, and when an active address corresponds to one defective row among the one or more defective rows, activating a repair signal and providing an additional active address that designates a row to be activated additionally; a random pulse generation circuit suitable for generating a random pulse signal that is randomly activated; and a sampling circuit suitable for sampling and storing the active address when an active signal and the random pulse signal are activated and the repair signal is deactivated, and randomly sampling and storing one among the active address and the additional active address when the active signal, the random pulse signal and the repair signal are activated.

In accordance with still another embodiment of the present disclosure, a method for operating a memory includes: activating, among rows of memory cells, first and second rows in response to an active command for activating the first row and based on relationship information between the first and second rows; selecting one of the first and second rows based on whether odd or even is a number of times that the active command is provided during a random time amount; and refreshing, among the rows of memory cells, one or more rows adjacent to the selected row.

DETAILED DESCRIPTION

Figure 1:
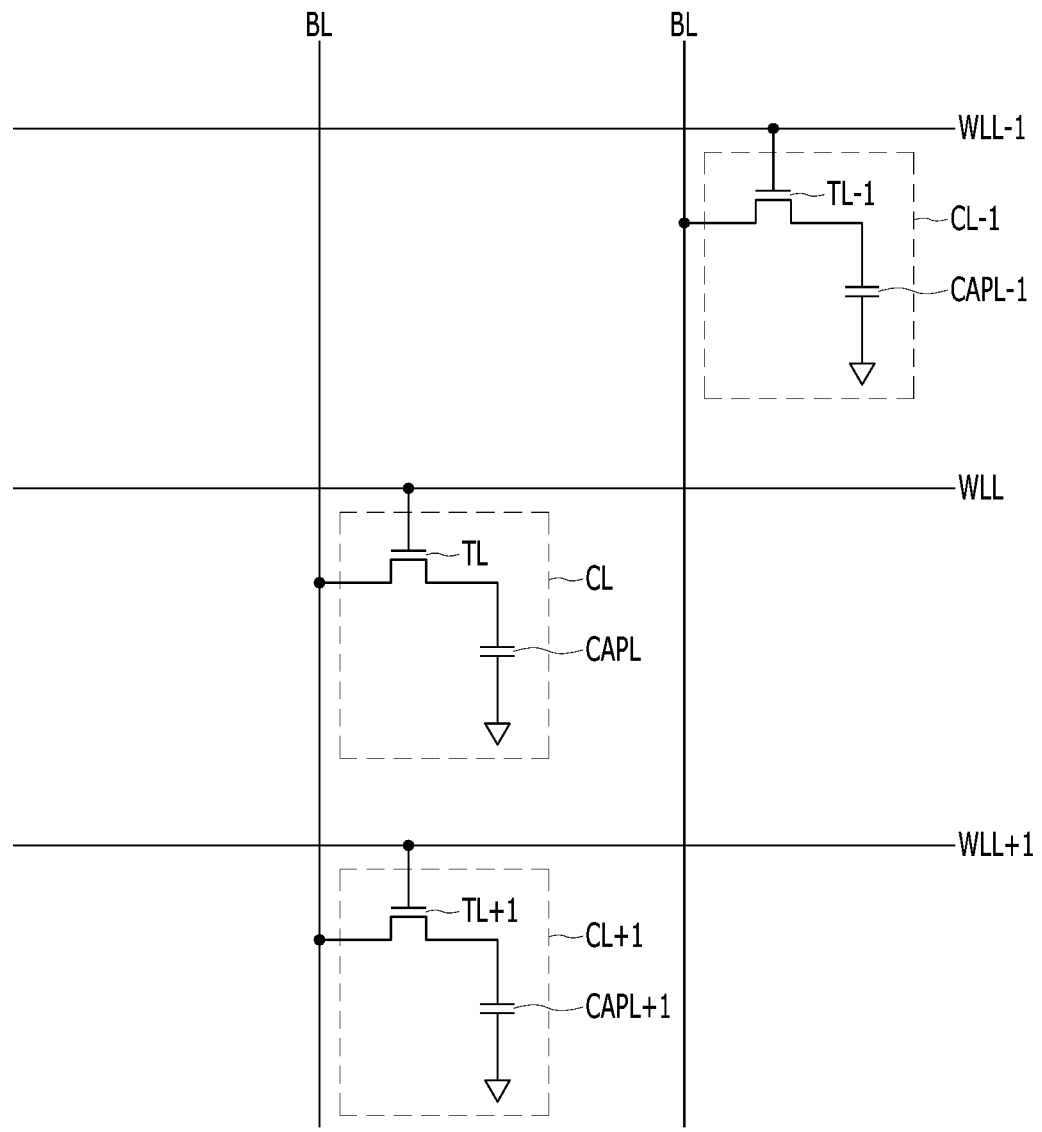
FIG. 1 is a schematic diagram illustrating row hammering.

Various embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

Figure 2:
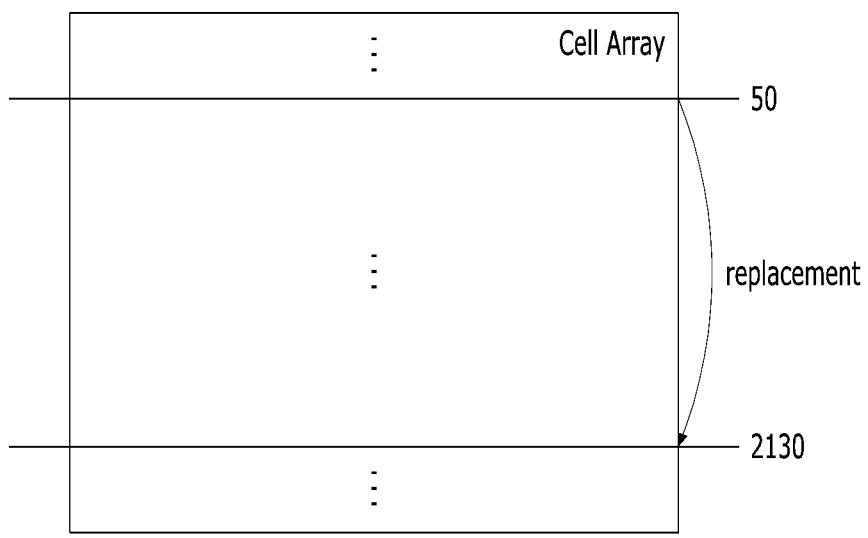
FIGS. 2 and 3 are diagrams illustrating a repair operation of a memory.
Figure 3:
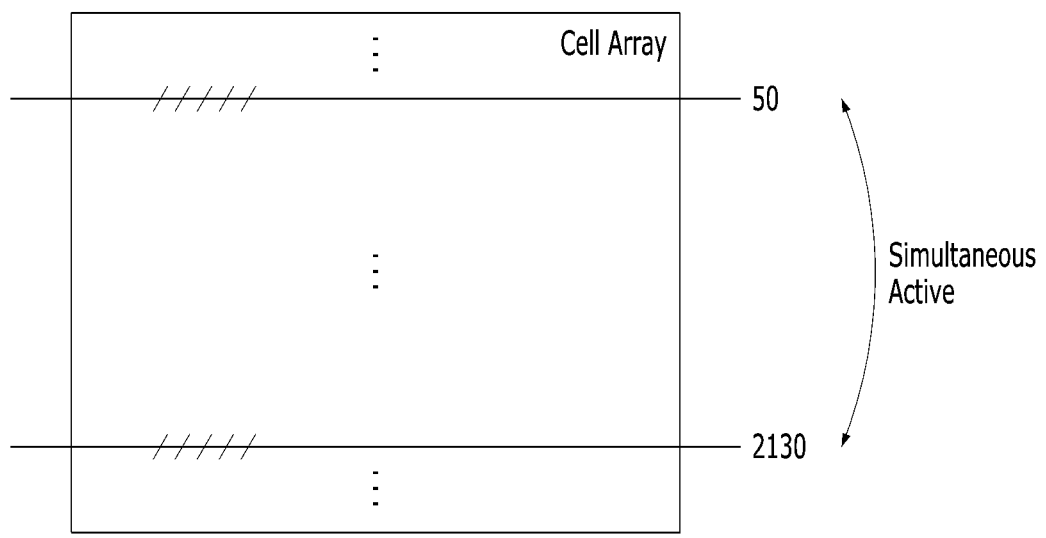

FIGS. 2 and 3 are diagrams illustrating a repair operation of a memory.

FIG. 2 shows a general row repair scheme. When a defect exists in some memory cells of a row 50 (word line) in a cell array, the row 50 may be replaced with a row 2130. In this case, since the row 50 is completely replaced with the row 2130, the row 50 may not be activated during an active operation, but the row 2130 may be activated instead of the row 50. When a memory controller commands an active operation to be performed on the row 50 multiple times, the row 2130 may be activated multiple times in the memory, and rows 2129 and 2130, which are neighboring rows of the row 2130, may be subjected to row hammering attacks. Therefore, during a smart refresh operation in preparation for the row hammering attacks, a refresh operation may be performed on the neighboring rows of the row 2130.

FIG. 3 shows a paired row repair scheme. When there is a defect in the memory cells of columns 255 to 511 of a row 50 in the cell array (indicated by hatching), the memory cells of the columns 255 to 511 of the row 50 may be replaced with the memory cells of the columns 255 to 511 of the row 2130 in the cell array. In this case, since only some columns of the row 50 are replaced with some columns of the row 2130, the rows 50 and 2130 may be activated at the same time during an active operation of the row 50. In a read or write operation after the active operation, when the columns 255 to 511 are selected, the memory cells in the row 2130 may be accessed, and when the remaining columns are selected, the memory cells in the row 50 may be accessed. For example, when a write operation for a column 3 is commanded after the row 50 and row 2130 are simultaneously activated, data may be written into the memory cells of the column 3 of the row 50, and when a read operation for a column 270 is commanded, data may be read from the memory cells of the column 270 of the row 2130.

In the case of using the paired row repair scheme, when the memory controller commands an active operation for the row 50 multiple times, the neighboring rows of the row 50, which are rows 49 and 51, and the neighboring rows of the row 2130, which are rows 2129 and 2131, may be subjected to row hammering attacks in the memory. Therefore, it may be difficult to cope with the row hammering attacks.

Figure 4:
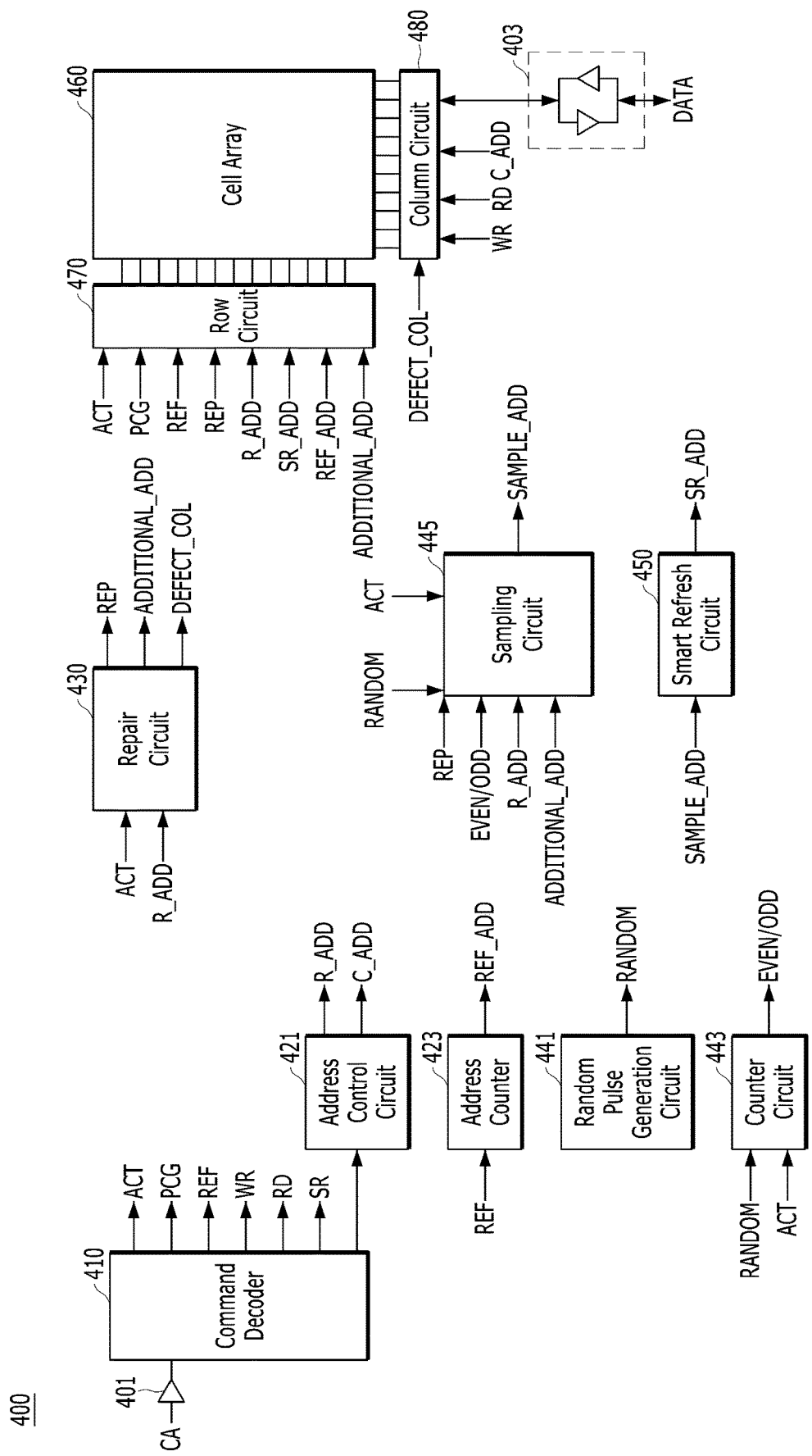
FIG. 4 is a block diagram illustrating a memory 400 in accordance with an embodiment of the present disclosure.

FIG. 4 is a block diagram illustrating a memory 400 in accordance with an embodiment of the present invention.

Referring to FIG. 4, the memory 400 may include a command address receiving circuit 401, a data transferring/receiving circuit 403, a command decoder 410, an address control circuit 421, an address counter 423, a repair circuit 430, a random pulse generation circuit 441, a counter circuit 443, a sampling circuit 445, a smart refresh circuit 450, a cell array 460, a row circuit 470, and a column circuit 480.

The command address receiving circuit 401 may receive a command and an address CA. Depending on the type of the memory 400, a command and an address may be input to the same input terminals, or the command and the address may be input to separate input terminals. Herein, it is illustrated that the command and the address are input to the same input terminals. The command and the address CA may be of multiple bits.

The data transferring/receiving circuit 403 may receive data DATA or transfer data DATA. The data transferring/receiving circuit 403 may receive data DATA to be written into the cell array 460 from the memory controller during a write operation, and during a read operation, the data transferring/receiving circuit 403 may transfer data DATA that are read from the cell array 460 to the memory controller.

The command decoder 410 may decode the command and the address CA to find out the type of the operation commanded by the memory controller to the memory 400 and generate internal command signals ACT, PCG, REF, WR, RD, and SR. An active signal ACT may be a signal that is activated when an active operation is commanded, and a precharge signal PCG may be a signal that is activated when a precharge operation is commanded. A refresh signal REF may be a signal that is activated when a (auto) refresh operation is commanded. A write signal WR may be a signal that is activated when a write operation is commanded, and a read signal RD may be a signal that is activated when a read operation is commanded. Also, a smart refresh signal SR may be a signal that is activated when a smart refresh operation is commanded. Herein, it is illustrated that the smart refresh signal SR is activated when the memory controller commands a smart refresh operation, but the smart refresh signal SR may also be activated when the memory 400 itself determines that a smart refresh operation is required to be performed.

The address control circuit 421 may classify the address received from the command decoder 410 as a row address R_ADD or a column address C_ADD. When it turns out as a result of the decoding in the command decoder 410 that an active operation is commanded, the address control circuit 421 may classify the received address as a row address R_ADD. When it turns out as a result of the decoding in the command decoder 410 that read and write operations are commanded, the address control circuit 421 may classify the received address as a column address C_ADD. Since the row address R_ADD is an address designating a row on which an active operation is to be performed, it may also be referred to as an active address.

The address counter 423 may generate a refresh address REF_ADD to be used in a refresh operation. The address counter 423 may change the refresh address REF_ADD by +1 whenever the refresh signal REF is activated. Since the refresh address REF_ADD is changed whenever the refresh signal REF is activated, the rows of the cell array 460 may be sequentially refreshed.

The repair circuit 430 may store information about the defective rows among the rows of the cell array 460. Here, the information about the defective rows may include information related to (1) a list of defective rows, (2) which columns of a defective row are defective, and (3) which row is to be additionally activated to replace some columns of a defective row.

The repair circuit 430 may check whether a row corresponding to the row address R_ADD is a defective row or not during an active operation in which the active signal ACT is activated, and when the row corresponding to the row address R_ADD is a defective row, the repair circuit 430 may activate the repair signal REP. Also, the repair circuit 430 may provide the row circuit 470 with an additional active address ADDITIONAL_ADD for designating a row to be additionally activated when the repair signal REP is activated. Also, when the repair signal REP is activated, the repair circuit 430 may provide the column circuit 480 with information DEFECT COL about which columns of a defective row are defective.

The random pulse generation circuit 441 may generate a random pulse signal RANDOM, which is activated randomly. The activation period of the random pulse signal RANDOM and the length (pulse width) of an activation period may be changed randomly. The random pulse generation circuit 441 may be a Pseudorandom Binary Sequence (PRBS) generator.

The counter circuit 443 may count the number of times that the active signal ACT is activated during a period in which the random pulse signal RANDOM is activated. The counter circuit 443 may generate an even/odd signal EVEN/ODD. The even/odd signal EVEN/ODD may be a signal whose level is changed whenever the active signal ACT is activated in the period in which the random pulse signal RANDOM is activated. The even/odd signal EVEN/ODD may be a signal representing whether the active signal ACT is activated an even number of times or odd number of times during the activation period of the random pulse signal RANDOM. Since the logic level of the even/odd signal EVEN/ODD is affected by the activation moments of the random pulse signal RANDOM and the active signal ACT having a random cycle and pulse width and the number of times that the random pulse signal RANDOM and the active signal ACT are activated, it may be that the logic level of the even/odd signal EVEN/ODD are determined randomly. The counter circuit 443 may be activated based on the random pulse signal RANDOM, and the counter circuit 443 may be a 1-bit counter that counts the number of times that the active signal ACT is activated.

The sampling circuit 445 may sample and store the row address R_ADD when the repair signal REP is deactivated and the active signal ACT and the random pulse signal RANDOM are activated. Since the random pulse signal RANDOM is a signal that is randomly activated, one among the row addresses at which active operations are performed may be randomly selected and sampled. The address SAMPLE_ADD sampled by the sampling circuit 445 may be determined to be an address at which an active operation is performed excessively many times.

The sampling circuit 445 may randomly select and sample one among the row address R_ADD and the additional active address ADDITIONAL_ADD when the repair signal REP is activated and the active signal ACT and the random pulse signal RANDOM are activated. When the repair signal REP is activated, a row corresponding to the row address R_ADD and a row corresponding to the additional active address ADDITIONAL_ADD may be activated in the cell array 460. Therefore, when the row corresponding to the row address R_ADD is activated excessively many times, the row corresponding to the additional active address ADDITIONAL_ADD may also be activated excessively many times. For this reason, the sampling circuit 445 may randomly select and sample one among the row address R_ADD and the additional active address ADDITIONAL_ADD when the repair signal REP is activated and the active signal ACT and the random pulse signal RANDOM are activated. Even/odd signals EVEN/ODD having random characteristics may be used for the sampling circuit 445 to randomly select one among the row address R_ADD and the additional active address ADDITIONAL_ADD.

The smart refresh circuit 450 may provide the row circuit 470 with a smart refresh address SR_ADD so that the neighboring rows of the row corresponding to the address SAMPLE_ADD which is sampled by the sampling circuit 334 may be refreshed when the smart refresh signal SR is activated. The smart refresh address SR_ADD may be an address corresponding to a neighboring row of the row corresponding to the sampled address SAMPLE_ADD. Since the sampled address SAMPLE_ADD is an address that is highly likely to be an address that has been activated excessively many times, the neighboring row of the row corresponding to the sampled address SAMPLE_ADD may be a row that is row-hammer-attacked. In other words, the smart refresh circuit 450 may provide the row circuit 470 with the row address SR_ADD corresponding to the row that is row-hammer-attacked during a smart refresh operation so that the row that is row-hammer-attacked may be refreshed.

The cell array 460 may include a plurality of memory cells that are arranged in a plurality of rows and a plurality of columns. Each of the memory cells may include a cell capacitor and a cell transistor. In the cell array 460, row lines arranged in a row direction may be referred to as word lines, and column lines arranged in a column direction may be referred to as bit lines. Each of the memory cells may be coupled to one among the row lines and one among the column lines.

The row circuit 470 may activate a row which is selected based on the row address R_ADD among the rows of the cell array 460 when the active signal ACT is activated and the repair signal REP is deactivated. Namely, the row circuit 470 may activate a word line which is selected based on the row address R_ADD among the word lines of the cell array 460. When the active signal ACT and the repair signal REP are activated, the row circuit 470 may activate a row which is selected based on the row address R_ADD among the rows of the cell array 460 and a row which is selected based on the additional active address ADDITIONAL_ADD. Also, when the precharge signal PCG is activated, the row circuit 470 may precharge the activated row.

The row circuit 470 may refresh the row which is selected based on the refresh address REF_ADD among the rows of the cell array 460 when the refresh signal REF is activated. That is, the memory cells in the row selected based on the refresh address REF_ADD may be refreshed. Also, the row circuit 470 may refresh a row which is selected based on the smart refresh address SR_ADD when the smart refresh signal SR is activated. The rows whose data are likely to be lost due to a row hammer attack in the cell array 460 may be refreshed by the smart refresh operation.

The column circuit 480 may write data into the memory cells of the columns that are selected based on the column address C_ADD among the columns of the cell array 460 when the write signal WR is activated. Also, when the read signal RD is activated, the column circuit 480 may read data from the memory cells of the columns that are selected based on the column address C_ADD among the columns of the cell array 460. When the repair signal REP is activated, that is, when two rows are activated, the column circuit 480 may determine memory cells of which row among the two activated rows it is to access based on the bad column information DEFECT COL. For example, as illustrated in FIG. 3, when the rows 50 and 2130 are activated and some of the columns 255 to 511 are selected based on the column address C_ADD during a read operation or a write operation, the column circuit 480 may access the memory cells of the columns selected based on the column address C_ADD in the row 2130. Also, when some of the columns other than the columns 255 to 511 are selected based on the column address C_ADD during a read operation or a write operation, the memory cells of the columns selected based on the column address C_ADD in the row 50 may be accessed.

Figure 5:
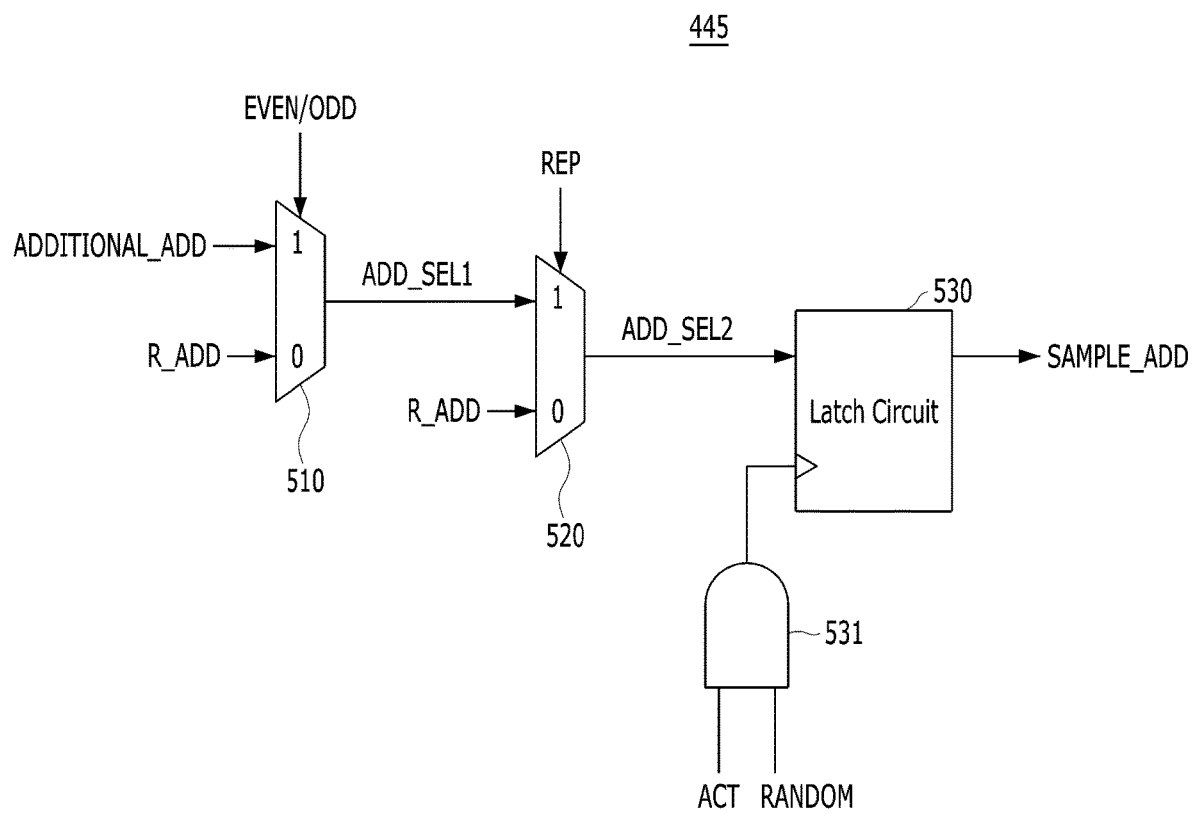
FIG. 5 is a block diagram illustrating a sampling circuit 445 shown in FIG. 4 in accordance with an embodiment of the present disclosure.

FIG. 5 is a block diagram illustrating the sampling circuit 445 shown in FIG. 4 in accordance with an embodiment of the present disclosure.

Referring to FIG. 5, the sampling circuit 445 may include a first selection circuit 510, a second selection circuit 520, and a latch circuit 530.

The first selection circuit 510 may select and output one among the additional active address ADDITIONAL_ADD and the row address R_ADD in response to the even/odd signal EVEN/ODD. When the even/odd signal EVEN/ODD is at a high level, the first selection circuit 510 may select and output the additional active address ADDITIONAL_ADD. When the even/odd signal EVEN/ODD is at a low level, the first selection circuit 510 may select and output the row address R_ADD. Also, the first selection circuit 510 may perform the selection operation reversely. Since the level of the even/odd signal EVEN/ODD is randomly determined, the first selection circuit 510 may randomly select and output one among the row address R_ADD and the additional active address ADDITIONAL_ADD.

The second selection circuit 520 may select and output one of the address ADD_SEL1 selected by the first selection circuit 510 and the row address R_ADD in response to the repair signal REP. When the repair signal REP is activated, the second selection circuit 520 may select and output the address ADD_SEL1 selected by the first selection circuit 510, and when the repair signal REP is deactivated, the second selection circuit 520 may select and output the row address R_ADD. Accordingly, the output address ADD_SEL2 of the second selection circuit 520 may be the row address R_ADD when the repair signal REP is deactivated, and when the repair signal REP is activated, the output address ADD_SEL2 of the second selection circuit 520 may be the address ADD_SEL1 randomly selected among the row address R_ADD and the additional active address ADDITIONAL_ADD.

The latch circuit 530 may receive and store the address ADD_SEL2 selected by the second selection circuit 520 while the active signal ACT and the random pulse signal RANDOM are activated, that is, while the output signal of an AND gate 531 is at a high level.

Figure 6:
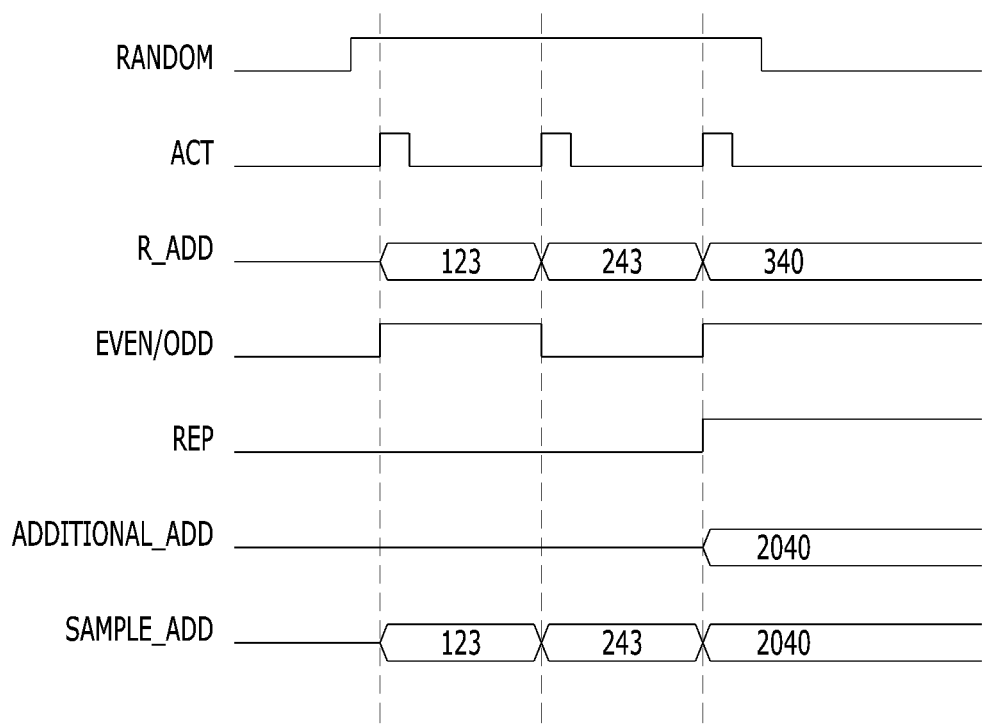
FIG. 6 is a timing diagram illustrating an operation of the memory 400 shown in FIG. 4 in accordance with an embodiment of the present disclosure.

FIG. 6 is a timing diagram illustrating an operation of the memory 400 shown in FIG. 4 in accordance with an embodiment of the present disclosure.

Referring to FIG. 6, while the random pulse signal RANDOM is activated to a high level, the active signal ACT may be activated three times. To have a look at the row address R_ADD, in the first active operation, a row 123 is activated, and in the second active operation, a row 243 is activated, and in the third active operation, a row 340 is activated. Also, since the repair signal REP is activated in the third active operation, a row 2040 may be activated together with the row 340 according to the additional active address ADDITIONAL_ADD.

Also, it may be seen that the level of the even/odd signal EVEN/ODD is changed to high, low, and high levels whenever the active signal ACT is activated during the activation period of the random pulse signal RANDOM.

It may be seen that the address SAMPLE_ADD sampled by the latch circuit 530 of the sampling circuit 445 becomes the row 123 in the first active operation and becomes the row 243 in the second active operation. Also, it may be seen that during the third active operation, since the repair signal REP is at a high level and the even/odd signal EVEN/ODD is at a high level, the row 2040 corresponding to the additional active address ADDITIONAL_ADD becomes the sampled address SAMPLE_ADD. Since the random pulse signal RANDOM is deactivated to a low level while the active operation is performed for the third time, the sampled address SAMPLE_ADD may be determined as the 2040 row.

Finally, since the row 2040 is sampled by the sampling circuit 445, when a smart refresh operation is performed subsequently, the neighboring rows of the row 2040 may be refreshed.

According to the embodiment of the present invention, it is possible to efficiently cope with a row hammering attack.

According to the embodiments of the present invention, even when two rows are simultaneously activated due to a paired row repair scheme at a random sampling moment, it may be possible to efficiently defend against a row hammering attack by randomly selecting and sampling one among the two activated rows.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A method for operating a memory, the method comprising:
   receiving an active command and a row address for a first row;
   confirming that a portion of columns of the first row is replaced with a portion of columns of a second row;
   activating the first row and the second row in response to the active command for the first row;
   confirming activation of a random pulse;
   selecting a row address corresponding to the first row when a number of times that the first row is activated during the activation of the random pulse is one of odd and even numbers;
   selecting a row address corresponding to the second row when the number is the other one of the odd and even numbers; and
   sampling the selected row address as a sampling address.

2. The method of claim 1, further comprising:
   determining to perform a smart refresh operation; and
   refreshing a neighboring row which is positioned adjacent to a row corresponding to the sampling address.

3. The method of claim 1, wherein the randomly selecting includes:
   counting a number of times that the active command is applied during an activation period of the random pulse;
   selecting the row address corresponding to the first row address when the number is an even number, and selecting the row address corresponding to the second row address when the number is an odd number; and
   storing the selected row address as the sampling address.

4. A memory, comprising:
   a cell array including a plurality of memory cells that are arranged in a plurality of rows and a plurality of columns;
   a repair circuit suitable for:
   storing information about at least one defective rows having a failure in a portion of columns among the rows, and
   activating a repair signal and providing an additional active address representing a row that is to be activated additionally in response to an active command provided together with an active address for the defective row;
a random pulse generation circuit suitable for generating a random pulse signal that is randomly activated; and
a sampling circuit suitable for sampling and storing:
the active address when the active signal and the random pulse signal are activated and the repair signal is deactivated,
the active address when a number of times that the active signal is activated in an activation period of the random pulse signal is one of odd and even numbers and when the active signal, the random pulse signal and the repair signal are activated, and
the additional active address when the number is the other one of the odd and even numbers and when the active signal, the random pulse signal and the repair signal are activated.

5. The memory of claim 4, further comprising a row circuit suitable for activating a row corresponding to the active address among the rows of the cell array when the active signal is activated, and
activating a row corresponding to the additional active address together with the row corresponding to the active address among the rows of the cell array when the repair signal is activated.

6. The memory of claim 5, wherein the row circuit is further suitable for accessing, when the row corresponding to the active address and the row corresponding to the additional active address are activated in the cell array, one among the two activated rows based on a column address during read and write operations.

7. The memory of claim 5, further comprising a smart refresh circuit suitable for controlling the row circuit to refresh a neighboring row of a row corresponding to an address stored in the sampling circuit during a smart refresh operation.

8. An operating method of a memory, the operating method comprising:
activating, among rows of memory cells, first and second rows in response to an active command for activating the first row;
selecting one of the first and second rows based on whether odd or even is a number of times that the active command is provided during a random time amount; and
refreshing, among the rows of memory cells, one or more rows adjacent to the selected row,
wherein at least one memory cell in the first row is replaced with a corresponding memory cell in the second row according to a paired row repair scheme.

* * * * *